(12) United States Patent
Menczigar et al.

(10) Patent No.: US 6,573,754 B2
(45) Date of Patent: Jun. 3, 2003

(54) CIRCUIT CONFIGURATION FOR ENABLING A CLOCK SIGNAL IN A MANNER DEPENDENT ON AN ENABLE SIGNAL

(75) Inventors: Ullrich Menczigar, Vaterstetten (DE); Patrick Heyne, München (DE)

(73) Assignee: Infineon Technologies AG, Munich (DE)

( * ) Notice: Subject to any disclaimer, the term of this patent is extended or adjusted under 35 U.S.C. 154(b) by 22 days.

(21) Appl. No.: 10/125,088

(22) Filed: Apr. 18, 2002

(65) Prior Publication Data

US 2002/0153924 A1 Oct. 24, 2002

(30) Foreign Application Priority Data

Apr. 18, 2001 (DE) .......................................... 101 19 051

(51) Int. Cl.[7] ................................................ H03K 19/00
(52) U.S. Cl. ............................. 326/93; 326/82; 326/56
(58) Field of Search ........................ 326/37, 46, 56–58, 326/82, 83, 96, 93, 95

(56) References Cited

U.S. PATENT DOCUMENTS

| 3,989,960 A | * | 11/1976 | Kodama ........................ 326/93 |
| 5,233,617 A | * | 8/1993 | Simmons et al. .............. 326/94 |
| 6,044,026 A | * | 3/2000 | Morgan ......................... 326/93 |
| 6,163,172 A | * | 12/2000 | Bazuin et al. ................. 326/93 |
| 6,166,564 A | * | 12/2000 | Rosen ........................... 326/93 |
| 6,204,695 B1 | | 3/2001 | Alfke et al. |

* cited by examiner

Primary Examiner—Don Phu Le
Assistant Examiner—Doris King
(74) Attorney, Agent, or Firm—Laurence A. Greenberg; Werner H. Stemer; Ralph E. Locher

(57) ABSTRACT

A circuit configuration for enabling a clock signal in a manner dependent on an enable signal has first and second signal paths that are fed to a NAND gate. The second signal path contains an RS flip-flop, upstream of which NAND gates are connected, which, for their part, are connected via different inverters to the input terminals for the clock signal and the enable signal, respectively.

6 Claims, 2 Drawing Sheets

FIG 1
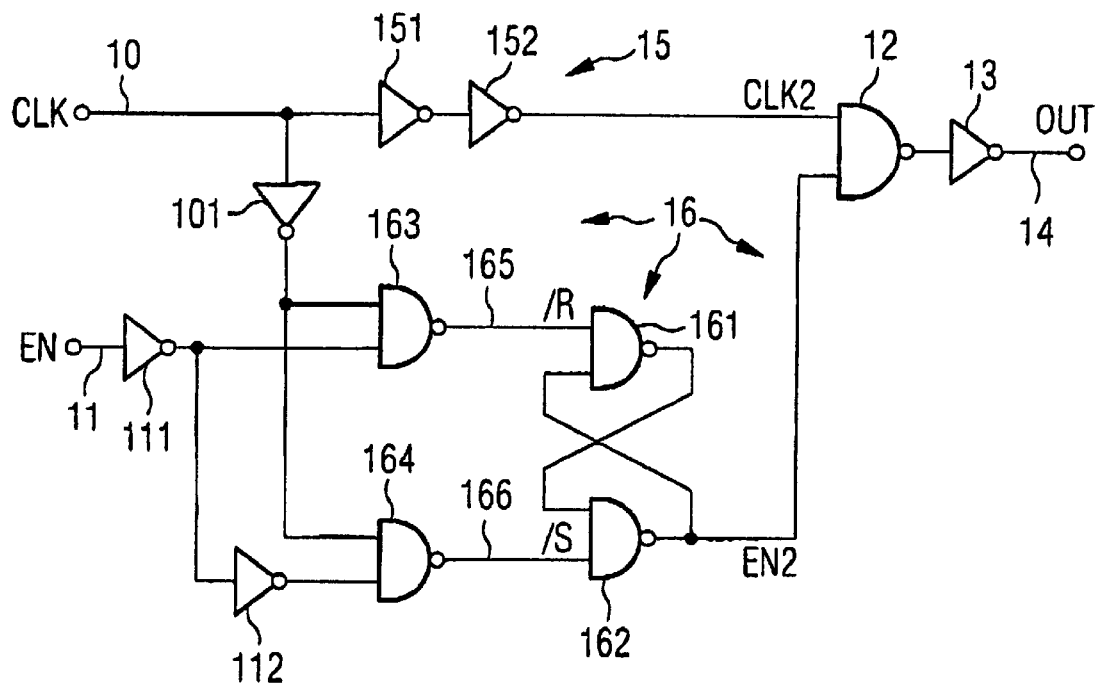
FIG 3A
Prior Art
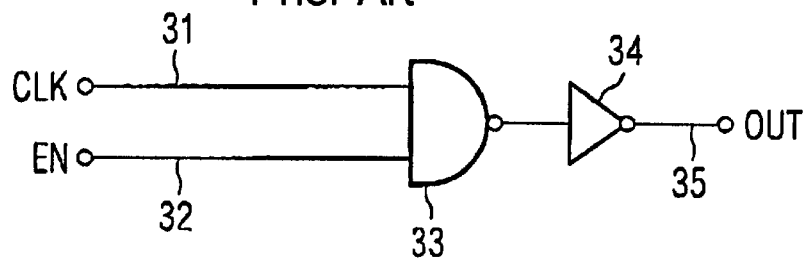
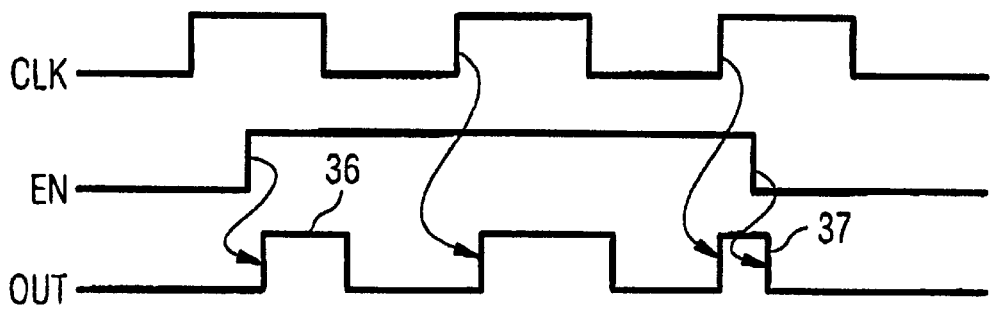
FIG 3B
Prior Art

CIRCUIT CONFIGURATION FOR ENABLING A CLOCK SIGNAL IN A MANNER DEPENDENT ON AN ENABLE SIGNAL

BACKGROUND OF THE INVENTION

Field of the Invention

The invention relates to a circuit configuration for enabling a clock signal in a manner dependent on an enable signal having a first input terminal for the clock signal and a second input terminal for the enable signal.

Circuit configurations of the type mentioned in the introduction are required at a wide variety of places in digital circuitry. By way of example, integrated semiconductor memories which are operated clock-synchronously, so-called synchronous dynamic random access memories (SDRAMs), require a clock signal to be forwarded or blocked in a manner dependent on an enable signal. The clock signal to be enabled is fed in for example in a delay locked loop (DLL). Owing to its specific internal method of operation, the DLL circuit can assume undefined operating states when clock signals that do not have a predetermined minimum length are fed in. Thus, the DLL circuit is not permitted, in particular, to be driven with pulses which, compared with normal operation, are about only half as long or even shorter. In this specific environment and also in further conceivable applications, there is the requirement, therefore, that a clock signal that is present is forwarded in a manner dependent on an enable signal. In other words, only complete clock pulses are forwarded, i.e. clock pulses having half a clock period, and available on the output side. At the same time, however, it is desirable for the first complete clock pulse to be provided as early as possible after an edge of the enable signal.

SUMMARY OF THE INVENTION

It is accordingly an object of the invention to provide a circuit configuration for enabling a clock signal in a manner dependent on an enable signal which overcomes the above-mentioned disadvantages of the prior art devices of this general type, in which incomplete pulses are avoided.

With the foregoing and other objects in view there is provided, in accordance with the invention, a circuit configuration for enabling a clock signal in a manner dependent on an enable signal. The circuit configuration includes a first input terminal for receiving the clock signal, a second input terminal for receiving the enable signal, an output terminal providing an enabled clock signal, a plurality of inverters, a first logic combination element having input terminals and an output connected to the output terminal, a first signal path having a delay element with an input side connected to the first input terminal and an output connected to the first logic combination element, and a second signal path having an input side coupled to the first input terminal and to the second input terminal and an output connected to the first logic combination element. The second signal path contains second logic combination elements and a storage element having a set input and a reset input. The set input and the reset input are connected to and driven by the second logic combination elements. The second logic combination elements each have a first input connected to the first input terminal through an equal number of the inverters. The second logic combination elements each have a second input connected to the second input terminal through a different number of the inverters.

The circuit configuration according to the invention ensures that a full-length pulse is generated on the output side only when the clock signal has a low level. When the clock signal has a high level, pulse generation is suppressed on the output side. Only with the next low level of the clock signal is the enable signal, which has then already been changed over, used for generating on the output side the first pulse of the enabled clock signal. The circuit configuration according to the invention furthermore has the advantage that the first pulse of the clock signal on the output side is generated relatively early.

The circuit configuration according to the invention can be used particularly advantageously in synchronous DRAMs (SDRAMs) for driving a delay locked loop (DLL). The delay locked loop generates the clock signal with which the data are provided cyclically on the output side. In order to respond as rapidly as possible to a read command directed at the semiconductor memory and in order thereby to make a short response time possible, it is necessary for the clock signal provided by the circuit configuration to be generated as early as possible as a complete pulse after a switch-on edge of the enable signal. The changeover from the power-saving mode to the normal mode of the DRAM, in which the DLL must be functionally ready, is thereby accelerated.

A delayed clock signal is generated and fed to the second logic combination element on the output side. In order to delay the clock signal, the delay element in the first signal path has an even number of series-connected inverters.

The first logic combination element is expediently a NAND gate, with an inverter connected downstream thereof. The enabled clock signal is tapped off at the output of the inverter.

A so-called RS flip-flop, that is to say a storage element which can be set by a pulse at a first input and reset by a pulse at a second input, is connected upstream of the other input of the second logic combination element. Connected upstream of the inputs of the RS flip-flop are respective NAND gates which, on the one hand, can be driven in an inverted manner by the clock signal on the input side and, on the other hand, can be driven in a complementary manner with respect to one another by the enable signal. For this purpose, in each case one input of the NAND gates is connected via an inverter to the first input terminal for the clock signal. The other input of the NAND gates is connected to the second input terminal for the enable signal via an inverter and, respectively to the second input terminal via two series-connected inverters.

The RS flip-flop is formed from NAND gates whose outputs are in each case fed back in a cross-coupled manner to an input of the other NAND gate. The RS flip-flop is set and reset by negative pulses at a respective one of the inputs of the NAND gates.

The signal propagation times of all the signal paths, that is to say, on the one hand, from the first input terminal to the first logic combination element and from the first input terminal via the two inputs of the RS flip-flop to the other input of the first logic combination element and, on the other, from the second input terminal via the two signal paths of the RS flip-flop to the first logic combination element, are in each case dimensioned identically, with the result that a rising or falling edge of the respective input signal experiences approximately the same delay time as far as the first logic combination element. Such delay times can be set in a known manner through suitable dimensioning of the transistors of the NAND gates used or of the inverters. For this purpose, the current driver capability of the transistors is to be dimensioned correspondingly through the setting of their width/length ratio (W/L) of their channel.

Other features which are considered as characteristic for the invention are set forth in the appended claims.

Although the invention is illustrated and described herein as embodied in a circuit configuration for enabling a clock signal in a manner dependent on an enable signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a circuit configuration according to the invention;

FIG. 3A is a circuit diagram of a circuit configuration according to the prior art; and FIG. 3B is a timing diagram showing a timing sequence of signals that occur in the circuit configuration shown in FIG. 3B.

DESCRIPTION OF THE PREFERRED EMBODIMENTS

Figure 2:
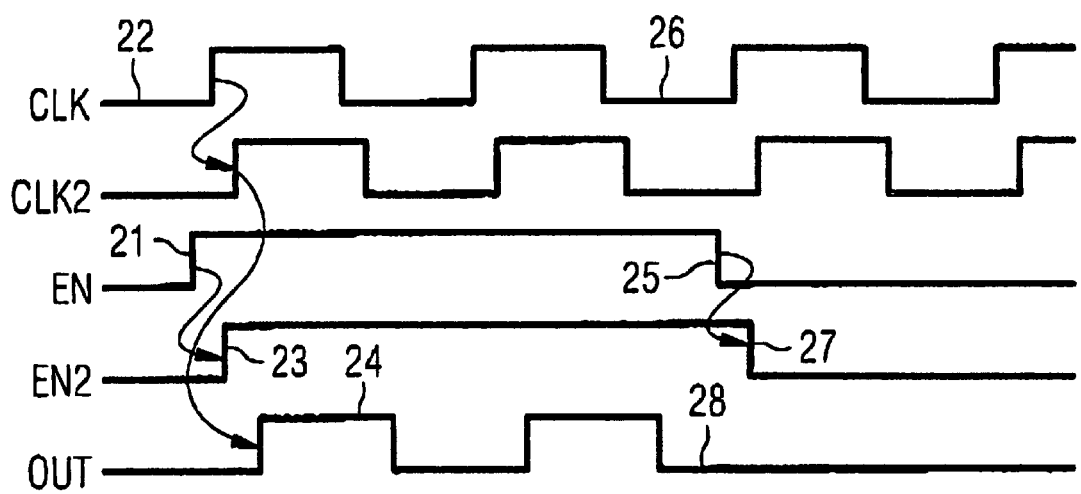
FIG. 2 is a timing diagram showing a timing sequence of signals which occur in the circuit configuration shown in FIG. 1.
Figure 2:
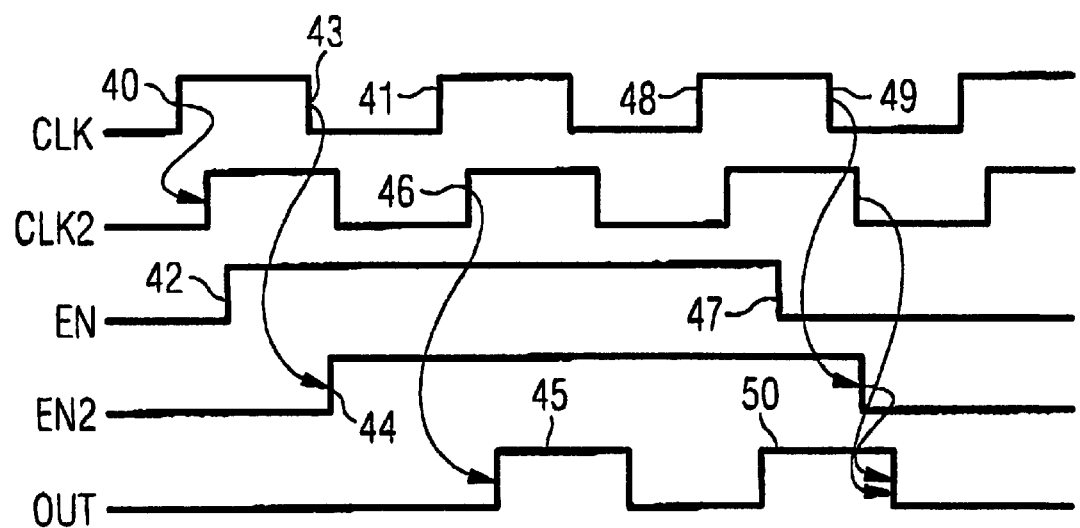

Referring now to the figures of the drawing in detail and first, particularly, to FIG. 3A thereof, there is shown a clock signal CLK which has clock pulses in a periodically consecutive manner and is provided at an input terminal 31 in a conventional manner. An enable signal EN, which has a low level in an inactive state and indicates by a rising edge that the clock signal CLK is to be enabled, is provided at a second input terminal 32. The two signals CLK, EN are logically combined with one another in a NAND gate 33. An inverter 34 connected downstream of the output of the NAND gate 33 generates the enabled clock signal OUT at an output 35. A NAND gate logically NANDs its input signals.

What is problematic in the known circuit configuration is if a rising edge for enabling the clock signal CLK or a falling edge for blocking the clock signal CLK is present during a high level phase of the clock signal CLK. The output signal OUT then has shortened pulses 36, 37 (see FIG. 3B). If the output terminal 35 is fed to a delay locked loop, for example a SDRAM, the delay locked loop can assume undesired operating states. The reading-out of data from the SDRAM could then violate standardized specifications.

The circuit shown in FIG. 1 likewise has an input terminal 10 for the clock signal CLK and an input terminal 11 for the enable signal EN. The enabled output signal OUT can be tapped off at an output terminal 14. A first signal path 15 connects the input terminal 10 via a delay element 15 to an input of a NAND gate 12. The delay element 15 contains an even number of inverters, for example two series-connected inverters 151, 152. A clock signal CLK2, which is delayed relative to the clock signal CLK on the input side, is present at the output of the delay element 15.

A second signal path 16 combines the input terminal 10 and the input terminal 11 with one another on the input side and generates a modified enable signal EN2, which is fed to another input of the NAND gate 11. The output signal OUT is generated from the output of the NAND gate 12 by inversion via an inverter 13 connected downstream. The output terminal 14 is directly connected to the output of the inverter 13.

The second signal path 16 has an RS flip-flop formed from two NAND gates 161, 162. The output of the NAND gate 161 is fed back to an input of the NAND gate 162, and the output of the NAND gate 162 is fed back to an input of the NAND gate 161. The other inputs 165, 166 of the NAND gates 161 and 162, respectively, form the inputs of the RS flip-flop. The RS flip-flop is reset by a negative pulse /R, i.e. the output signal EN2 assumes a low level. The RS flip-flop is set by a negative pulse /S at the terminal 166, i.e. the signal EN2 assumes a high level. The inputs 165, 166 are connected to the output terminals of a respective NAND gate 163, 164. The input terminal 10 for the clock signal CLK is connected via an inverter 101 to one input of the NAND gates 163, 164. The input terminal 11 for the enable signal EN is connected via an inverter 111 to the other input of the NAND gate 163. The other input of the NAND gate 164 is connected to the input terminal 11 via an inverter 112, which is connected in series with the inverter 111.

The signal diagram in FIG. 2 shows that the clock signal CLK2 is shifted from the clock signal CLK by the delay time effected by the delay element 15. If the input signal EN has a rising edge 21 which is present during the low phase 22 of the clock signal CLK, then a rising edge 23 is generated in the modified enable signal EN2 after the delay time which acts along the path 11, 111, 112, 164, 166, 162. At the output 14, a first enabled pulse 24 for the clock signal OUT on the output side is then produced in a manner delayed by the signal propagation time along the NAND gate 12 and the inverter 13. A falling edge 25 during a low phase 26 of the clock signal CLK affects a falling edge 27 after a delay time along the path 11, 111, 163, 165, 161. The output clock signal OUT is blocked again and remains at a low level.

What is essential is that all the delay times of a level at the input terminal 10 or at the input terminal 11 to the inputs of the NAND gate 12 are approximately of the same length. In other words, the delay times along the path 10, 15 and along the path 10, 101, 163, 165, 161 and along the path 10, 101, 164, 166, 162 and also along the path 11, 111, 163, 165, 161 and along the path 11, 111, 112, 164, 166, 162 are in each case approximately of the same length. This has the effect that the signals CLK2 and EN2 that are present at the inputs of the NAND gate 12 have a phase shift of virtually zero relative to one another. Therefore, in all cases, the high phase of the signal CLK2 that appears at the output terminal 14 for the output signal OUT is approximately of the same length as a high phase of the clock signal CLK at the input terminal 10. The set up time of the enable signal EN, which must be complied with before an edge of the clock signal CLK, is kept minimal. The set up time is that time which an edge of the enable signal EN must comply with before a rising edge of the clock signal CLK in order still to be able to be processed during the subsequent high phase of the clock signal CLK. Only if the enable signal EN has a shorter set up time is the output signal OUT not generated until with the next but one high phase of the clock signal CLK.

The last-mentioned case is illustrated in the bottom signal diagram of FIG. 2. An edge 42 of the enable signal EN violates the set up time with regard to an edge 40 of the clock signal CLK. The edge 42 temporally succeeds the edge 40. The modified enable signal EN2 has an edge 44 which is delayed in response to a falling edge 43 of the clock signal CLK along the signal path 101, 163, 165, 161. A first pulse 45 of the output signal OUT is finally generated after a rising edge 41 of the clock signal CLK and a rising edge 46 of the delayed clock signal CLK2. A falling edge 47 of the enable signal EN, which again does not comply with the set up time with regard to the rising edge 48 of the clock signal CLK, generates a falling edge of the modified enable signal EN2 in response to a falling edge 49 of the clock signal CLK, which is delayed along the signal path 101, 164, 166, 162. Finally, the pulse 50 of the output signal OUT is there upon ended.

The circuit configuration illustrated in FIG. 1 has the effect that an edge, both rising and falling, of the enable signal EN directly brings about a change in the output signal OUT only when the clock signal CLK has a low level. If the clock signal CLK has a high level, the output signal OUT is not switched. It is precisely this case that, in the circuit according to the prior art as shown in FIG. 3, leads to shortened pulses 36, 37 that would lead to the violation of specifications when fed into a DLL in an SDRAM.

We claim:

1. A circuit configuration for enabling a clock signal in a manner dependent on an enable signal, comprising:

a first input terminal for receiving the clock signal;

a second input terminal for receiving the enable signal;

an output terminal providing an enabled clock signal;

a plurality of inverters;

a first logic combination element having input terminals and an output connected to said output terminal;

a first signal path having a delay element with an input side connected to said first input terminal and an output connected to said first logic combination element; and a second signal path having an input side coupled to said first input terminal and to said second input terminal and an output connected to said first logic combination element, said second signal path containing second logic combination elements and a storage element having a set input and a reset input, said set input and said reset input connected to and being driven by said second logic combination elements, said second logic combination elements each having a first input connected to said first input terminal through an equal number of said inverters, said second logic combination elements each having a second input connected to said second input terminal through a different number of said inverters.

2. The circuit configuration according to claim 1, wherein said delay element has an even number of series-connected further inverters.

3. The circuit configuration according to claim 1, wherein said first logic combination element is formed of a NAND gate and an inverter connected downstream of said NAND gate, said inverter having an output connected to said output terminal for providing the enabled clock signal.

4. The circuit configuration according to claim 1, wherein said second logic combination elements are NAND gates, said first input of said NAND gates connected to said first input terminal through one of said inverters, and said second input of a first of said second logic combination elements is connected to said second input terminal through a different one of said inverters, and said second input of a second one of said second logic combination elements is connected to said second input terminal through two of said inverters being two series-connected inverters.

5. The circuit configuration according to claim 1, wherein said storage element has two NAND gates each with an output and inputs, said output of each of said NAND gates is fed back to one of said inputs of another one of said NAND gates.

6. The circuit configuration according to claim 1, wherein said first signal path and said second signal path from said first input terminal and from said second input terminal to said input terminals of said first logic combination element in each case have signal propagation times of substantially equivalent lengths.

* * * * *